(12) United States Patent
Hamabe

(10) Patent No.: US 11,240,909 B2
(45) Date of Patent: Feb. 1, 2022

(54) ANTENNA DEVICE

(71) Applicant: Panasonic Intellectual Property Management Co., Ltd., Osaka (JP)

(72) Inventor: Taichi Hamabe, Kanagawa (JP)

(73) Assignee: PANASONIC INTELLECTUAL PROPERTY MANAGEMENT CO., LTD., Osaka (JP)

(*) Notice: Subject to any disclaimer, the term of this patent is extended or adjusted under 35 U.S.C. 154(b) by 285 days.

(21) Appl. No.: 16/711,654

(22) Filed: Dec. 12, 2019

(65) Prior Publication Data

US 2020/0196439 A1 Jun. 18, 2020

(30) Foreign Application Priority Data

Dec. 17, 2018 (JP) .............................. JP2018-235812

(51) Int. Cl.
*H05K 1/02* (2006.01)
*H01Q 9/04* (2006.01)

(52) U.S. Cl.
CPC ........... *H05K 1/0243* (2013.01); *H01Q 9/045* (2013.01); *H05K 2201/10098* (2013.01)

(58) Field of Classification Search
CPC ....... H05K 1/0243; H05K 2201/10098; H05K 1/0298; H05K 1/165; H05K 1/0253; H01Q 9/045; H01Q 1/48; H01Q 5/378; H01Q 15/006; H01Q 9/065
USPC .................................................. 343/700 MS
See application file for complete search history.

(56) References Cited

U.S. PATENT DOCUMENTS

| | | | | |
|---|---|---|---|---|
| 2003/0231142 A1* | 12/2003 | McKinzie, III | ...... | H01Q 15/008 343/909 |
| 2006/0092079 A1* | 5/2006 | de Rochemont | .... | H01Q 15/006 343/700 MS |
| 2007/0285318 A1* | 12/2007 | Sotoudeh | ............... | H01Q 1/243 343/702 |
| 2011/0156972 A1* | 6/2011 | Korva | ...................... | H01Q 1/48 343/745 |
| 2012/0256811 A1* | 10/2012 | Colburn | ................. | H05K 1/165 343/907 |
| 2013/0249752 A1* | 9/2013 | Alexopoulos | ............ | H01Q 1/38 343/745 |
| 2014/0203993 A1* | 7/2014 | Toyao | ..................... | H01P 5/107 343/867 |
| 2014/0225795 A1* | 8/2014 | Yu | ........................ | H01Q 13/085 343/767 |
| 2017/0033435 A1* | 2/2017 | Nakano | ..................... | H01Q 1/48 |
| 2017/0033468 A1* | 2/2017 | Wong | ................. | H01Q 15/0086 |
| 2017/0187229 A1* | 6/2017 | Hosseini | ............... | H02J 7/0042 |
| 2019/0098750 A1* | 3/2019 | Woo | ..................... | H05K 1/0236 |

(Continued)

FOREIGN PATENT DOCUMENTS

JP        2015-070542        4/2015

*Primary Examiner* — Don P Le

(74) *Attorney, Agent, or Firm* — Wenderoth, Lind & Ponack, L.L.P.

(57) ABSTRACT

An antenna device includes an antenna, a first ground conductor, and an artificial magnetic conductor. The artificial magnetic conductor is sandwiched between the antenna and the first ground conductor, and separated from the antenna and the first ground conductor. The first ground conductor includes a first cutaway part on one end side, the first cutaway part having a substantially rectangular shape.

7 Claims, 7 Drawing Sheets

(56) References Cited

U.S. PATENT DOCUMENTS

2019/0393603 A1\* 12/2019 Rutfors .................... H01Q 5/50
2021/0273319 A1\* 9/2021 Liu .................... H01Q 15/0006

\* cited by examiner

ANTENNA DEVICE

BACKGROUND

1. Technical Field

The present disclosure relates to an antenna device.

2. Description of the Related Art

PTL (Patent Literature) 1 discloses an antenna device that includes an artificial magnetic conductor.

PTL 1 is Unexamined Japanese Patent Publication No. 2015-70542.

SUMMARY

An object of the present disclosure is to provide an antenna device that achieves a wider band of a communication frequency and compactness while maintaining a frequency characteristic of a fundamental wave.

The present disclosure is an antenna device that includes an antenna, a first ground conductor, and an artificial magnetic conductor that is sandwiched between the antenna and the first ground conductor, and separated from the antenna and the first ground conductor. The first ground conductor includes a first cutaway part on end side, the first cutaway part having a substantially rectangular shape.

The present disclosure achieves a wider band of a communication frequency and compactness of an antenna device while maintaining a frequency characteristic of a fundamental wave.

DETAILED DESCRIPTION

Hereinafter, an exemplary embodiment (hereinafter, referred to as "present exemplary embodiment") in which a configuration and an operation of an antenna device according to the present disclosure are specifically disclosed will be described in detail with reference to the drawings as appropriate. However, in some cases, an unnecessarily detailed description may be omitted. For example, a detailed description of a well-known matter and a duplicated description of substantially the same configuration will be omitted in some cases. This is to avoid unnecessary redundancy in the following description and to facilitate understanding by those skilled in the art. The accompanying drawings and the following description are provided to enable those skilled in the art to sufficiently understand the present disclosure, and are not intended to limit the subject matter described in the claims.

In the following description, the antenna device according to the present exemplary embodiment is included in a main phone or an extension of a cordless telephone unit that uses a digital enhanced cordless telecommunications (DECT) system with a frequency band of 1.9 GHz, for example. The antenna device is used for not only the main phone or the extension of the cordless telephone unit described above but also many Internet of Things (IoT) devices such as a display unit of a television device, a seat monitor in an airplane, an electronic shelf label (for example, card-type electronic device that is attached to shelf in retail store and displays selling price of product), a smart speaker, an in-vehicle device, a microwave oven, and a refrigerator.

The present exemplary embodiment will describe a dipole antenna as an example of the antenna device. The description is applicable to a monopole antenna. The dipole antenna is formed by, for example, etching a metal foil on a printed wiring board that is a multilayer circuit board including a plurality of layers. The printed wiring board is constituted by a plurality of layers such as copper foil and glass epoxy.

Figure 1:
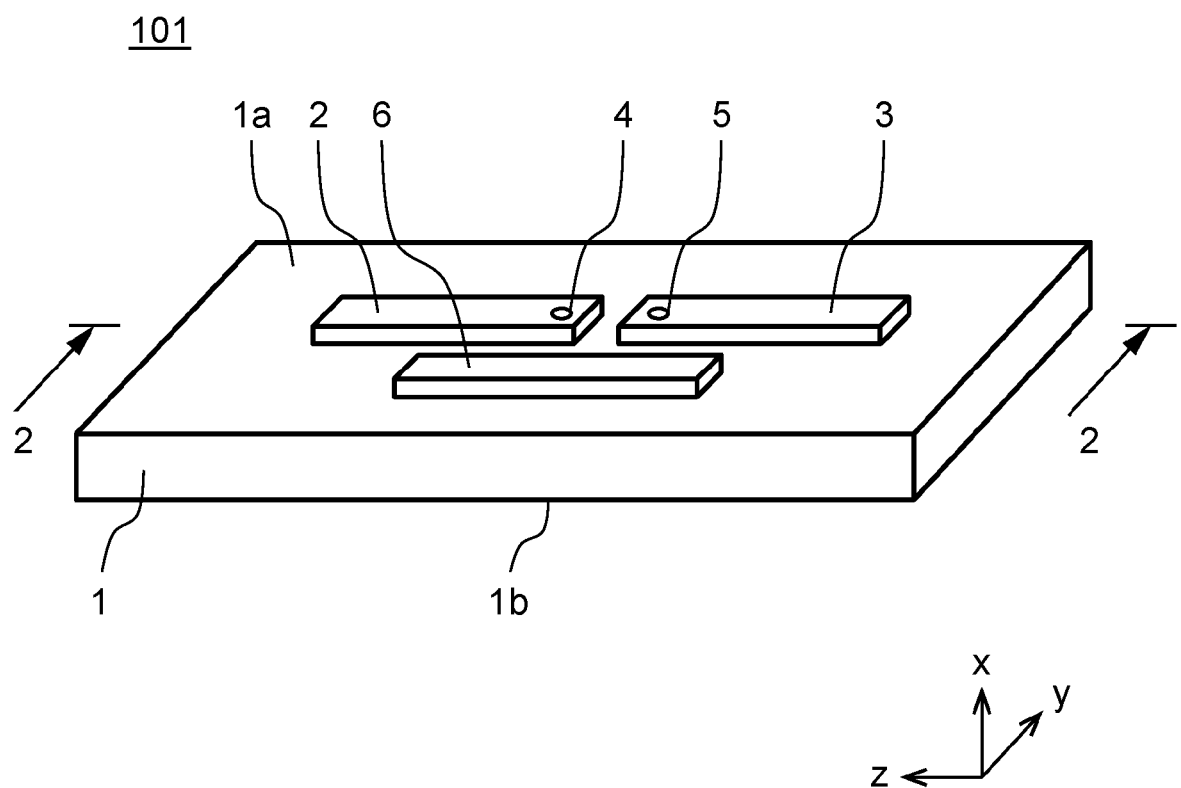
FIG. 1 is an external perspective view of an antenna device according to an exemplary embodiment.
Figure 2:
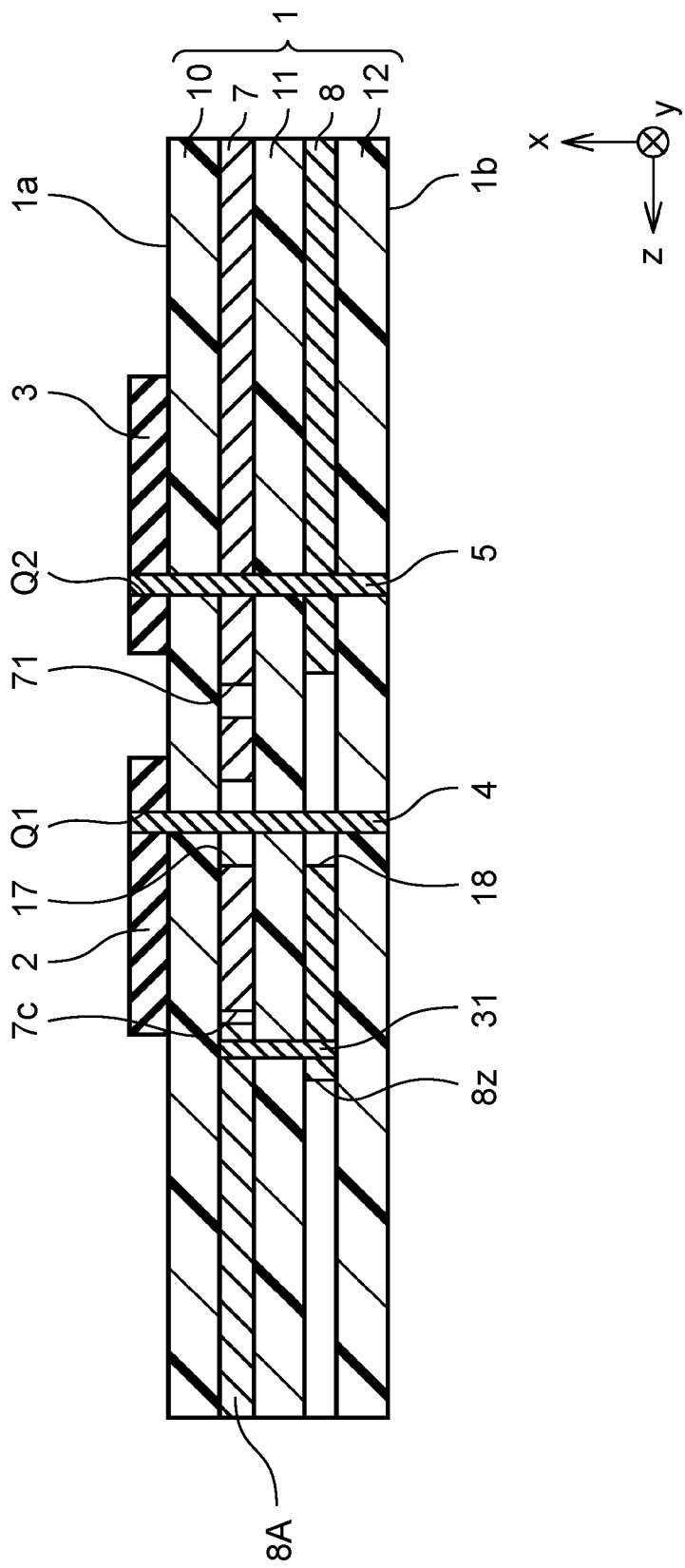
FIG. 2 is a vertical cross-sectional view taken along a line 2-2 of FIG. 1.
Figure 3:
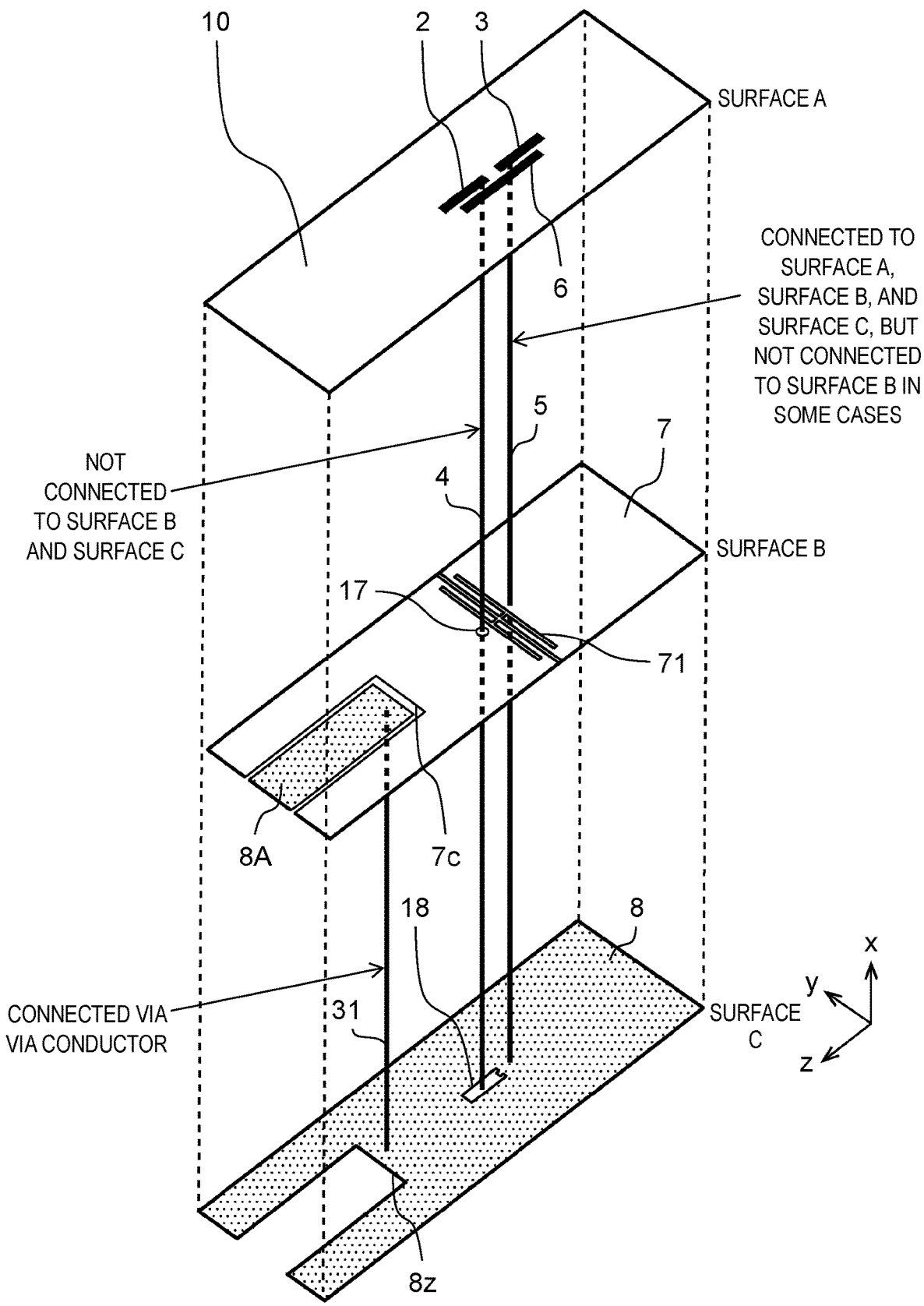
FIG. 3 is a perspective view illustrating an antenna surface, an AMC surface, and a ground surface that are included in a plurality of layers constituting the antenna device.
Figure 4:
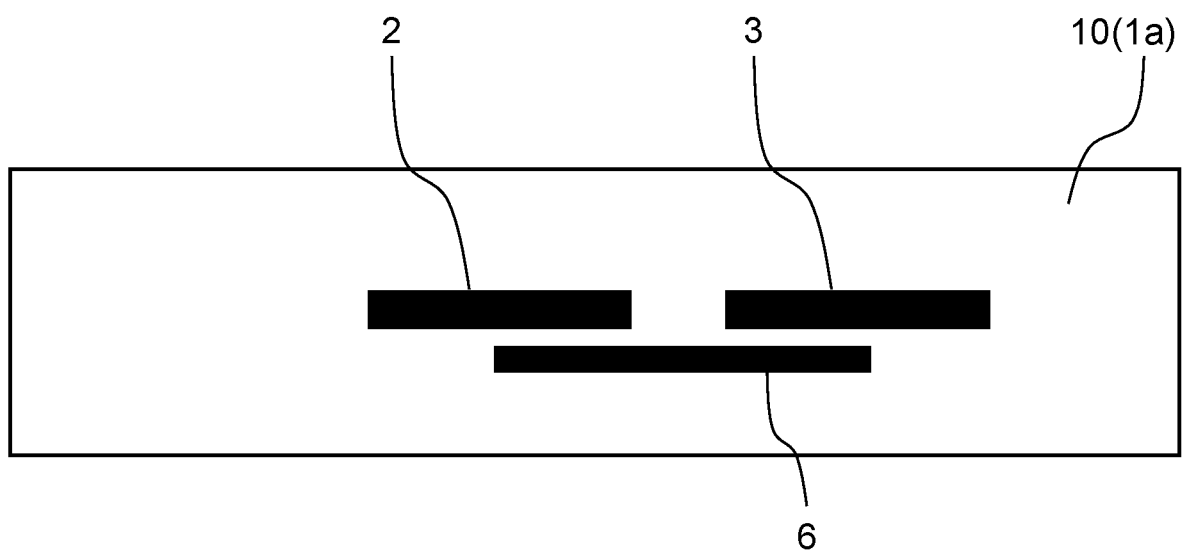
FIG. 4 is a plan view of the antenna surface that is a surface of a printed wiring board in the antenna device, an antenna conductor and a passive conductor being formed on the surface of the printed wiring board.
Figure 5:
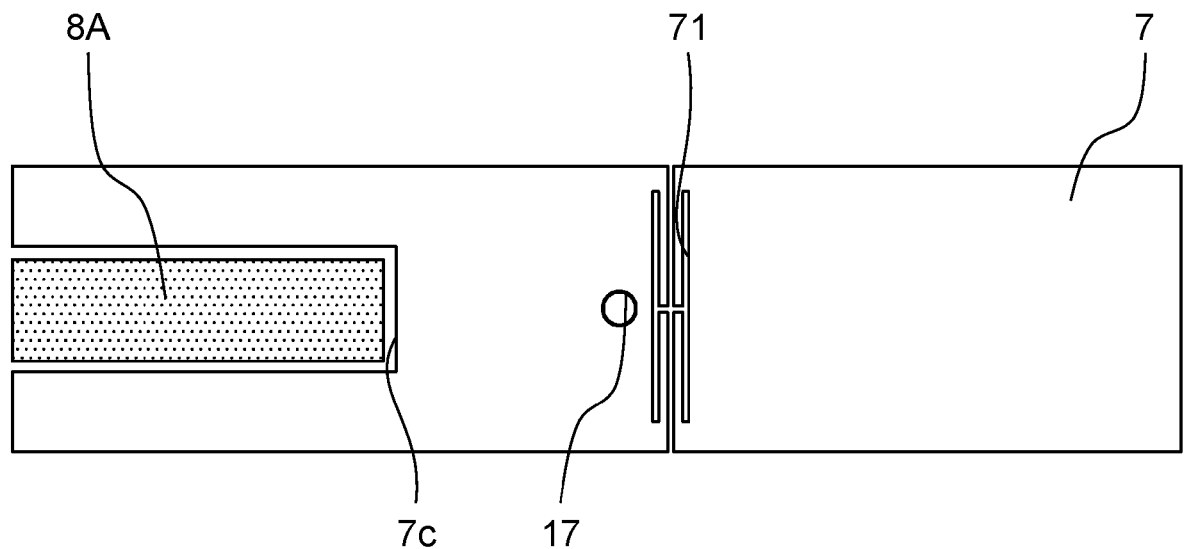
FIG. 5 is a plan view of the AMC surface in the antenna device, omitting layers upper than an AMC.
Figure 6:
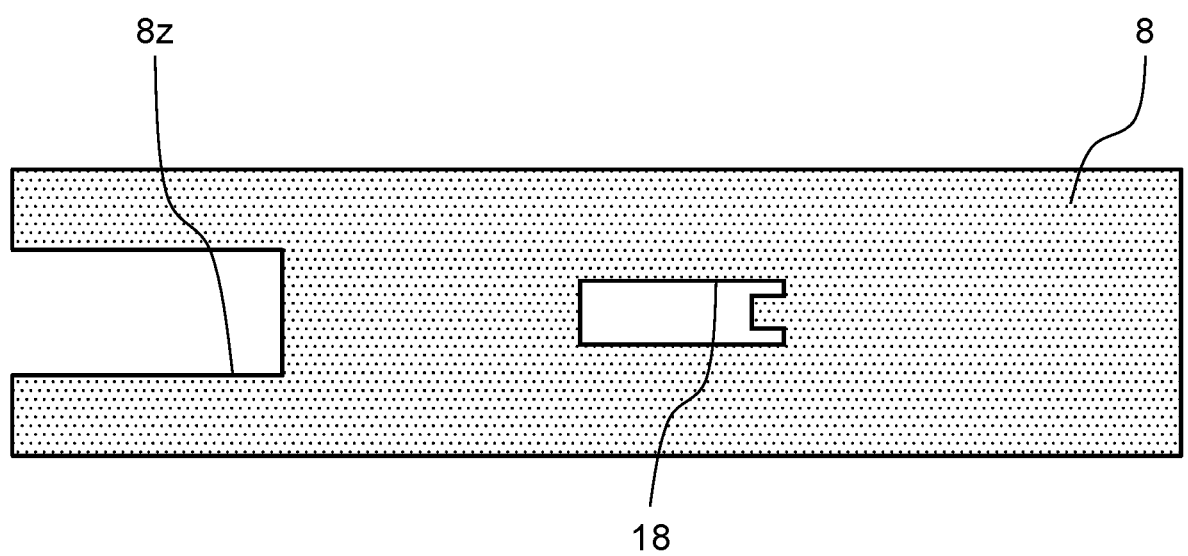
FIG. 6 is a plan view of the ground surface in the antenna device, omitting layers upper than a ground conductor.

FIG. 1 is an external perspective view of antenna device 101 according to the present exemplary embodiment. FIG. 2 is a vertical cross-sectional view taken along a line 2-2 of FIG. 1. FIG. 3 is a perspective view illustrating an antenna surface, an artificial magnetic conductor (AMC) surface, and a ground surface that are included in a plurality of layers constituting antenna device 101. FIG. 4 is a plan view of the antenna surface that is surface 1a of printed wiring board 1 in antenna device 101, antenna conductors 2, 3 and passive conductor 6 being formed on surface 1a of printed wiring board 1. FIG. 5 is a plan view of the AMC surface in antenna device 101, omitting layers upper than AMC 7 (layers in +x direction). FIG. 6 is a plan view of the ground surface in antenna device 101, omitting layers upper than ground conductor 8.

As illustrated in FIG. 1, antenna device 101 includes printed wiring board 1, antenna conductor 2 that is a strip conductor as an example of a feed antenna, antenna conductor 3 that is a strip conductor as an example of a parasitic antenna, and passive conductor 6 disposed on sides of antenna conductors 2, 3. Passive conductor 6 is electrically separated from antenna conductors 2, 3. Antenna conductors 2, 3 are connected respectively to via conductors 4, 5 in printed wiring board 1. Via conductor 4 constitutes a feed wire between feedpoint Q1 of antenna conductor 2 and a wireless communication circuit (not illustrated). The wireless communication circuit is mounted on back surface 1b of printed wiring board 1, for example. Via conductor 5 constitutes a ground wire between feedpoint Q2 of antenna conductor 3 and the wireless communication circuit described above.

Antenna conductors 2, 3 (sometimes collectively referred to as "antenna") constitute a dipole antenna, extending longitudinally on a straight line toward a positive side and a negative side in a z-direction. The dipole antenna is formed on front surface 1a of printed wiring board 1 such that ends of antenna conductors 2, 3 adjacent to feedpoints Q1, Q2 (hereinafter referred to as "feeder-side ends") are separated from each other at a predetermined distance. Ends opposite the feeder-side ends of antenna conductors 2, 3 (ends that are separated from each other at a largest distance in a plan view of antenna device 101) are hereinafter referred to as "distal-side ends" of antenna conductors 2, 3.

Passive conductor 6 is disposed adjacently to antenna conductors 2, 3 with a predetermined distance between passive conductor 6 and antenna conductors 2, 3. The predetermined distance is within a quarter of a received wave wavelength, for example. Passive conductor 6 is disposed on one side surface side of antenna conductor 2, 3 so as to be in parallel to a direction that antenna conductors 2, 3 are arranged (that is to say, positive side and negative side in z-direction). As passive conductor 6 is electrostatically couple to AMC 7 similarly to antenna conductors 2, 3, passive conductor 6 can increase electrostatic capacitance between antenna conductors 2, 3 and AMC 7 and shift a wireless frequency handled by antenna device 101 to a lower frequency band. A size and shape of passive conductor 6 and a number of passive conductors 6 are not particularly limited. If passive conductor 6 is disposed on a same side of AMC 7 as antenna conductors 2, 3 and electrostatically coupled to AMC 7, passive conductor 6 may be disposed on a same surface as AMC 7, as well as on a same surface as a surface on which antenna conductors 2, 3 are arranged.

As illustrated in FIG. 2, via conductors 4, 5 are formed by filling conductors in through-holes or via holes that are formed from front surface 1a to back surface 1b of printed wiring board 1 in a thickness direction. Antenna conductor 2 is connected to a power feed terminal of the wireless communication circuit (described above) on back surface 1b of printed wiring board 1 through via conductor 4 to function as a feed antenna. Antenna conductor 3 is connected to AMC 7 and ground conductors 8 in printed wiring board 1 and a ground terminal of the wireless communication circuit (described above) through via conductor 5 to function as a parasitic antenna.

In the description herein, the z-axis direction represents a longitudinal direction of antenna device 101 and antenna conductors 2, 3 of the antenna device. A y-axis direction represents a width direction of antenna device 101 and antenna conductors 2, 3 of the antenna device and is orthogonal to the z-axis direction. An x-axis direction represents a thickness direction of antenna device 101 and is orthogonal to an xy-plane. In printed wiring board 1, via conductors 4, 5 are formed at positions that are directly below respective feedpoints Q1, Q2 and that substantially oppose to each other. Printed wiring board 1 of antenna device 101 may be mounted on a printed wiring board in an electronic device, for example.

In FIG. 2, printed wiring board 1 that is a multilayer circuit board includes dielectric substrate 10, AMC 7, dielectric substrate 11, ground conductor 8, and dielectric substrate 12 that are stacked in this order. Dielectric substrates 10, 11, 12 are, for example, made of a material such as glass epoxy. AMC 7 is an artificial magnetic conductor that has perfect magnetic conductor (PMC) properties, and is formed of a predetermined metallic pattern. Use of AMC 7 enables the antenna device to achieve a reduction in thickness and an increase in gain.

Via conductor 4 is a feeder wire that has, for example, a cylindrical shape and is used to supply electric power for driving antenna conductor 2 as an antenna, and electrically connects antenna conductor 2 formed on front surface 1a of printed wiring board 1 to the power feed terminal of the wireless communication circuit (described above). Via conductor 4 is formed to be substantially coaxial with via conductor insulating holes 17, 18 that are respectively formed in AMC 7 and ground conductor 8 so as not to be electrically connected to AMC 7 and ground conductor 8 (see FIG. 3). A diameter of via conductor 4 is less than a diameter of via conductor insulating holes 17, 18 (see FIG. 2).

Meanwhile, via conductor 5 electrically connects antenna conductor 3 to the ground terminal of the wireless communication circuit (described above). Via conductor 5 is electrically connected to ground conductor 8 and AMC 7 (see FIG. 3). In FIG. 3, a surface on which antenna conductors 2, 3 are mounted (specifically, surface on dielectric substrate 10) is referred to as "surface A" for convenience, AMC 7 is referred to as "surface B" for convenience, and ground conductor 8 is referred to as "surface C" for convenience. As illustrated in FIG. 3, antenna conductor 2 is not connected to (that is, not conducted with) surface B and surface C, whereas antenna conductor 3 is connected to (that is, conducted with) surface A, surface B, and surface C. However, antenna conductor 3 does not need to be connected to surface B.

As illustrated in FIGS. 2, 3, and 5, AMC 7 includes slit 71 at a center part in the z-axis direction. Slit 71 penetrates AMC 7 in the thickness direction and extends to a vicinity of ends of AMC 7 in the width direction. AMC 7 also includes cutaway part 7c (one aspect of opening) that extends from a position separated from slit 71 at a predetermined distance in the longitudinal direction (that is to say, z-direction) to a left end of printed wiring board 1 (see FIG. 3). Cutaway part 7c is formed in a rectangular shape with a predetermined width in the width direction.

The artificial magnetic conductor is not formed in cutaway part 7c and slit 71 on a layer of AMC 7 (see surface B in FIG. 3). Slit 71 separates AMC 7 at antenna conductors 2, 3 to increase electrostatic coupling of antenna conductor 2 and a left side part of AMC 7 (that is to say, positive side in z-direction in FIG. 3) and electrostatic coupling of antenna conductor 3 and a right side part of AMC 7 (that is to say, negative side in z-direction in FIG. 3). Slit 71 may be formed to ends of AMC 7 in the width direction so as to completely separate AMC 7 into two pieces.

Ground conductor 8A is formed within cutaway part 7c. Ground conductor 8A is formed in a rectangular shape so as to be flush with AMC 7 along an inner periphery of cutaway part 7c with a clearance from an inner wall of cutaway part 7c. A hole is formed in ground conductor 8A so as to be electrically connected to one end of via conductor 31. A hole is formed in ground conductor 8 so as to be electrically connected to the other end of via conductor 31. Ground conductor 8A is conducted through via conductor 31 with ground conductor 8 (see FIGS. 2 and 3). As described above, the layer of AMC 7 (see surface B of FIG. 3) includes another ground layer (that is, ground conductor 8A) that is conducted with a layer of ground conductor 8 (ground layer, see surface C of FIG. 3). Consequently, it is possible to effectively secure an apparent area of the ground layer and thus to ensure performance of antenna device 101.

Ground conductor 8 is an earth region that is connected to the ground terminal of the wireless communication circuit (described above). Cutaway part 8z is formed at an end of ground conductor 8 in the longitudinal direction (that is to say, z-direction) (see FIGS. 2 and 3). Cutaway part 8z is formed in a rectangular shape with a predetermined width to extend from a position separated from a center part of ground conductor 8 at a predetermined distance in the longitudinal direction (that is to say, z-direction) to a left end of ground conductor 8. That is, cutaway part 8z is disposed on one end side of ground conductor 8 opposite to a position where via conductor 5 is disposed with a center of printed wiring board 1 being provided between cutaway part 8z and the position where via conductor 5 is disposed (that is to say, side of via conductor 4 illustrated in FIG. 2).

As cutaway part 8z is formed at one end side of ground conductor 8 opposite to via conductor 5, a length of an entire periphery of ground conductor 8 (that is, electrical length that represents path length of alternating current flowing in antenna device 101) increases. A wireless frequency band handled by antenna device 101 can be widened as compared to a case where cutaway part 8z is not formed. While cutaway part 8z is formed at a position of ground conductor 8 in the width direction in the present exemplary embodiment, cutaway part 8z may be formed at a plurality of positions in the width direction. In addition, a shape of cutaway part 8z is not limited to a rectangular shape. Cutaway part 8z may have a polygonal shape or any shape with projections and recesses so as to increase the electrical length.

Ground conductor 8 includes via conductor insulating hole 18 that is formed so as to cause via conductor 4 to penetrate ground conductor 8 and be electrically insulated from ground conductor 8 and a hole that is formed so as to cause via conductor 5 to penetrate ground conductor 8 and be electrically connected to ground conductor 8. Ground conductor 8 also includes a hole that is formed so as to cause via conductor 31 to penetrate ground conductor 8 and be electrically connected to ground conductor 8A.

In antenna device 101, a planar shape of AMC 7 and a planar shape of ground conductor 8 are a substantially same rectangular shape and are substantially congruent. AMC 7 and ground conductor 8 are formed to oppose and overlap each other at a predetermined distance in the thickness direction. One of AMC 7 and ground conductor 8 does not project from another one and thus compactness of printed wiring board 1 can be achieved. This leads to compactness of antenna device 101. While AMC 7 has cutaway part 7c and slit 71, a length of AMC 7 in the longitudinal direction is substantially equal to a length of ground conductor 8 in the longitudinal direction.

Next, a characteristic of a wireless frequency of antenna device 101 according to the present exemplary embodiment will be described.

The characteristic of the wireless frequency of parallel resonance antenna device 101 according to the present exemplary embodiment will be described while comparing with a serial resonance antenna device according to a comparative example. A configuration of the antenna device according to the comparative example is similar to the configuration of antenna device 101 except that ground conductor 8 does not have cutaway part 8z, AMC 7 does not have cutaway part 7c, and ground conductor 8A is not disposed within cutaway part 7c.

Figure 7:
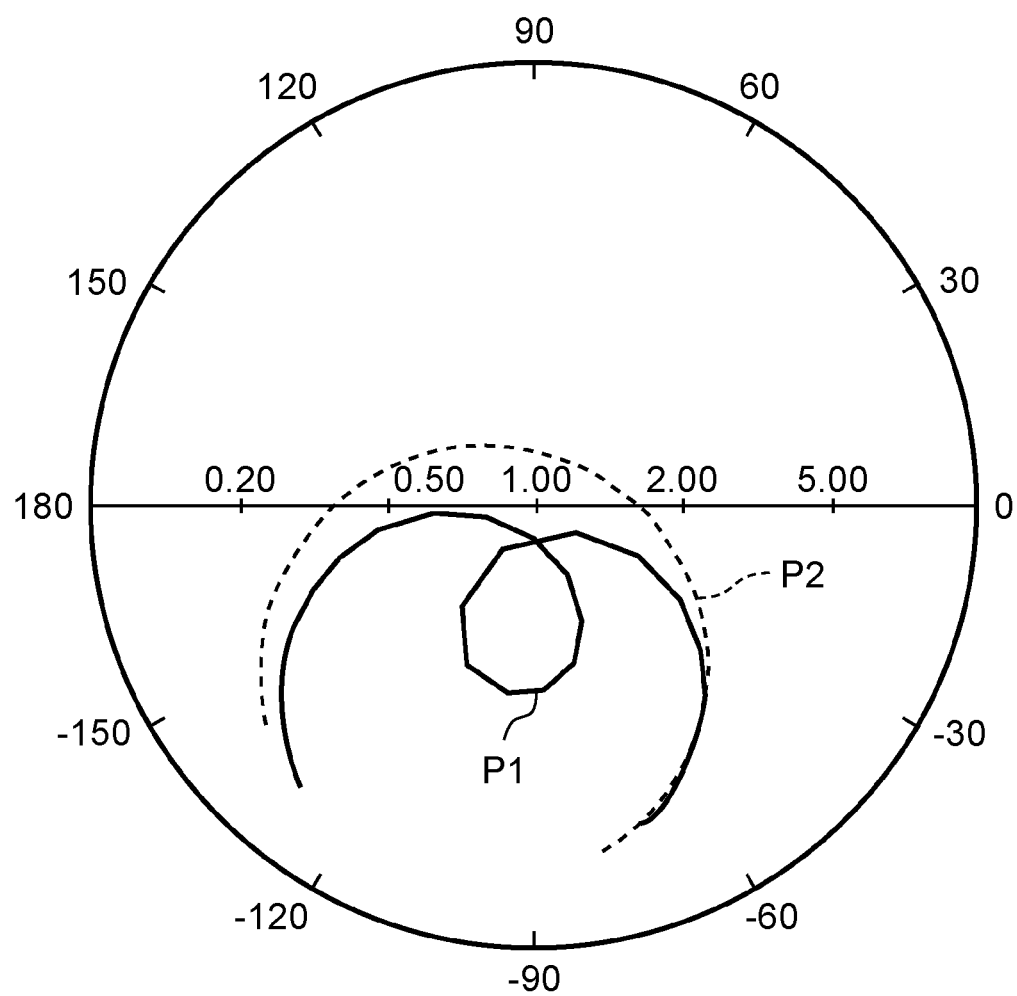
FIG. 7 is a directivity characteristic diagram illustrating an example of a radio wave radiation pattern in parallel resonance.

FIG. 7 is a directivity characteristic diagram illustrating an example of a radio wave radiation pattern in parallel resonance. In the directivity characteristic diagram, a center has a highest degree of impedance matching (maximum reflection coefficient 1). Radio wave radiation pattern P1 of antenna device 101 according to the present exemplary embodiment (solid line in FIG. 7) approaches the center of the directivity characteristic diagram, then separates temporarily from the center, and approaches the center again. That is, radio wave radiation pattern P1 has two curves approaching the center. Consequently, impedance matching occurs with high possibility and parallel resonance easily occurs. On the other hand, radio wave radiation pattern P2 of the antenna device according to the comparative example (broken line in FIG. 7) approaches the center of the directivity characteristic diagram once and then separates from the center, that is, has one curve. Consequently, serial resonance easily occurs. As radio wave radiation pattern P1 of antenna device 101 according to the present exemplary embodiment is placed near the center of the directivity characteristic diagram, a wider band can be achieved as compared to the antenna device according to the comparative example.

Figure 8:
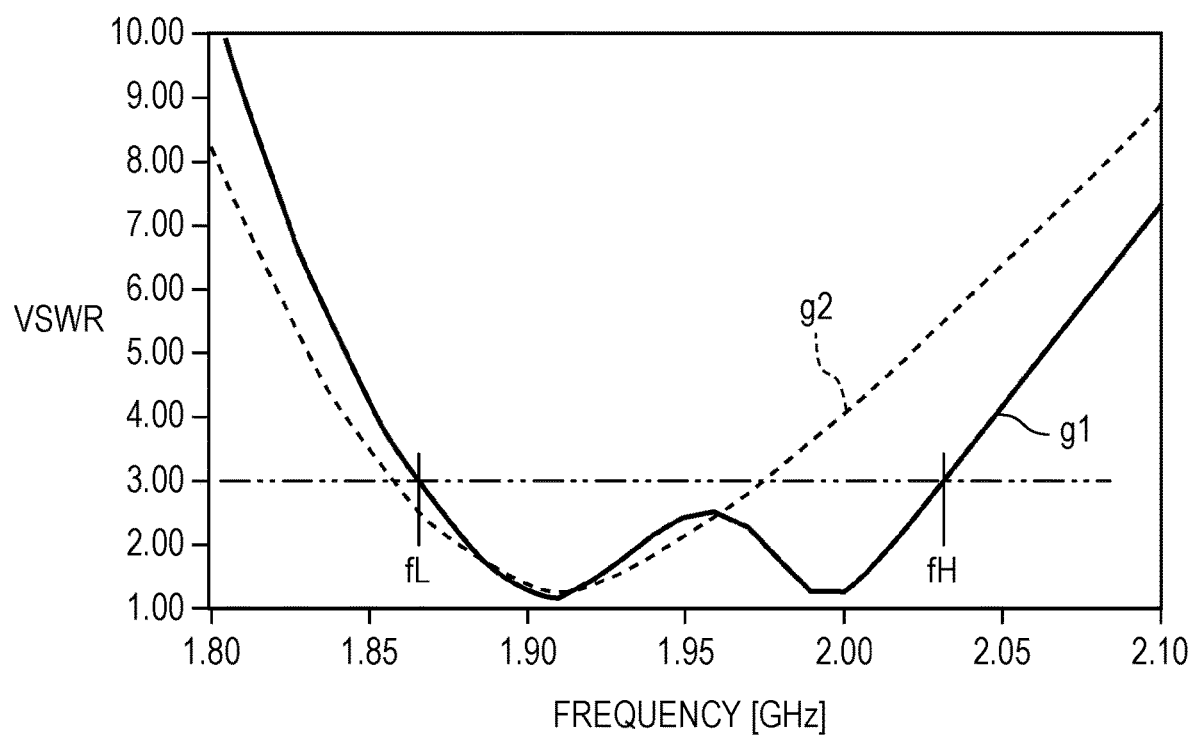
FIG. 8 is a graph illustrating a characteristic example of a voltage standing wave ratio of the antenna device.

FIG. 8 is a graph illustrating a characteristic example of a voltage standing wave ratio (VSWR) of antenna device 101. A vertical axis represents a VSWR and a horizontal axis represents a frequency. The voltage standing wave ratio represents the degree of impedance matching (that is to say, degree of reflection) by a rate of a traveling wave and a reflected wave in a standing wave. In particular, the voltage standing wave ratio is calculated using a rate of a maximum amplitude and a minimum amplitude of voltage of a radio wave that is a standing wave. As the VSWR is closer to 1, there are less reflected waves and impedance matching is achieved. Consequently, as the VSWR is closer to 1, radio wave transmission efficiency becomes higher. In the present exemplary embodiment, a frequency band with a VSWR of 3.0 or less is determined as a fractional bandwidth, and whether a frequency band is a wide band or a narrow band is determined by the fractional bandwidth. The fractional bandwidth is calculated by dividing a bandwidth with a VSWR of 3.0 or less by a center frequency. In FIG. 8, fH and fL denote respectively a maximum frequency and a minimum frequency of the bandwidth with a VSWR of 3.0 or less in antenna device 101.

FIG. 8 illustrates the fractional bandwidth in a frequency band near 1.9 GHz, for example. A frequency range with a VSWR of 3.0 or less ranges from 1.86 GHz to 2.03 GHz in antenna device 101, as indicated by graph g1. The VSWR is the lowest at a frequency of 1.91 GHz. On the other hand, the frequency range with a VSWR of 3.0 or less ranges from 1.86 GHz to 1.97 GHz in the antenna device according to the comparative example, as indicated by graph g2. The VSWR is the lowest at a frequency of 1.91 GHz.

It is found that cutaway part 8z formed in ground conductor 8 and ground conductor 8A disposed within cutaway part 7c of AMC 7 contribute greatly to a wider band of antenna device 101. As cutaway part 7c is formed in AMC 7, antenna device 101 can transmit and receive wireless signals in a fundamental wave band, prevent radiation of wireless signals in a second harmonic band, and reduce influence of higher harmonics.

As cutaway part 8z is formed in ground conductor 8 in printed wiring board 1 and ground conductor 8A is formed within cutaway part 7c of AMC 7 to be flush with AMC 7 in antenna device 101, the electrical length can be increased without increasing the longitudinal length of ground conductor 8. Consequently, it is possible to achieve a wider band of a wireless frequency of antenna device 101 and compactness of printed wiring board 1 including ground conductor 8. As a result, antenna device 101 is easily incorporated in more devices and thus has a wide range of use.

As described above, antenna device 101 according to the present exemplary embodiment includes antenna conductors 2, 3, ground conductor 8 (one aspect of first ground conductor), and artificial magnetic conductor 7 that is sandwiched between antenna conductors 2, 3 and ground conductor 8 so as to be disposed separately from antenna conductors 2, 3 and ground conductor 8. Ground conductor 8 includes cutaway part 8z (one aspect of first cutaway part) that has a rectangular shape on one end side. As cutaway part 8z is formed in ground conductor 8, the length of the entire periphery of ground conductor 8 (that is, electrical length that represents path length of alternating current flowing in antenna device 101) increases.

The wireless frequency band handled by antenna device 101 can thus be widened as compared to the case where cutaway part 8z is not formed. Consequently, antenna device 101 can achieve a wider band of a communication frequency and compactness of an antenna device while maintaining a frequency characteristic of a fundamental wave.

Antenna device 101 further includes via conductor 5 that is disposed separately from the center of printed wiring board 1, having a substantially rectangular shape, on which antenna conductor 3 is disposed and that causes antenna conductor 3, AMC 7, and ground conductor 8 to be conducted with each other. Cutaway part 8z is disposed on one end side of ground conductor 8 opposite to the position where via conductor 5 is disposed with the center of printed wiring board 1 being provided between cutaway part 8z and the position where via conductor 5 is disposed. As cutaway part 8z is formed on one end side of ground conductor 8 opposite to via conductor 5 in antenna device 101, a wider band is achieved.

Antenna device 101 also includes ground conductor 8A (one aspect of second ground conductor) that is conducted with ground conductor 8. AMC 7 includes cutaway part 7c (one aspect of second cutaway part) that has a substantially same area as cutaway part 8z in ground conductor 8 at a position substantially opposing cutaway part 8z in ground conductor 8. Ground conductor 8A is disposed in cutaway part 7c to be separated from AMC 7. As an AMC layer includes another ground layer that is conducted with a ground layer in antenna device 101, the apparent area of the ground layer is secured, so that the performance of the antenna device is ensured.

Antenna device 101 further includes passive conductor 6 that is disposed on printed wiring board 1 on which antenna conductors 2, 3 are disposed. As passive conductor 6 is electrostatically couple to AMC 7 similarly to antenna conductors 2, 3, passive conductor 6 can increase electrostatic capacitance between antenna conductors 2, 3 and AMC 7 and shift a wireless frequency to a lower frequency band. That is, a peak of the VSWR can be shifted to a lower frequency band.

Ground conductor 8 and AMC 7 are disposed to oppose and substantially overlap each other in a plan view. One of AMC 7 and ground conductor 8 does not project from another one and thus compactness can be achieved. This leads to compactness of antenna device 101.

The antenna includes antenna conductor 2 (one aspect of first antenna conductor) having feedpoint Q1 (one aspect of first feedpoint) and antenna conductor 3 (one aspect of second antenna conductor) having feedpoint Q2 (one aspect of second feedpoint), antenna conductor 3 being connected via conductor 5 to ground conductor 8, thus configuring a dipole antenna. With antenna device 101, it is possible to easily configure a dipole antenna that is highly versatile as a linear antenna.

AMC 7 includes slit 71 that separates antenna conductor 2 and antenna conductor 3 that are formed on an upper layer from each other. Consequently, slit 71 separates AMC 7 at antenna conductors 2, 3 to increase electrostatic coupling of antenna conductor 2 and the left side part of AMC 7 (+z-direction) and electrostatic coupling of antenna conductor 3 and the right side part of AMC 7 (−z-direction).

As illustrated in FIGS. 1 and 2, the feeder-side end of antenna conductor 2 on a side of via conductor 4 is disposed to be shifted to the z-direction side with respect to the center of printed wiring board 1 of antenna device 101. That is to say, according to antenna device 101 of the present exemplary embodiment, antenna conductors 2, 3 and passive conductor 6 are not disposed at the center of printed wiring board 1. As compared to a configuration in which antenna conductors 2, 3 and passive conductor 6 are disposed at the center of printed wiring board 1, it can be said that a part of printed wiring board 1 on the opposite side to a side at which cutaway part 8z is disposed in ground conductor 8 is substantially cut. Consequently, if a part of printed wiring board 1 on the opposite side to the side at which cutaway part 8z is disposed in ground conductor 8 is cut, cutaway part 8z is formed in ground conductor 8 and thus an effective electrical length (described above) can be secured. As a result, compactness of antenna device 101 is achieved.

The exemplary embodiment has been described with reference to the accompanying drawings; however, it is needless to say that the present disclosure is not limited to the example. Those skilled in the art can conceive various modifications, changes, substitutions, additions, deletions, and equivalents within the scope described in the claims and these rightly belong to the technical scope of the present disclosure. In addition, the components in the exemplary embodiment described above may be optionally combined without departing from the spirit of the invention.

The present disclosure is useful because the present disclosure achieves a wider band of a communication frequency and compactness of an antenna device while maintaining a frequency characteristic of a fundamental wave.

What is claimed is:

1. An antenna device comprising:
   an antenna;
   a first ground conductor; and
   an artificial magnetic conductor that is sandwiched between the antenna and the first ground conductor, and separated from the antenna and the first ground conductor,
   wherein the first ground conductor includes a first cutaway part on one end side, the first cutaway part having a substantially rectangular shape.

2. The antenna device according to claim 1, further comprising a via conductor that is disposed separately from a center of a board having a substantially rectangular shape and that causes the antenna, the artificial magnetic conductor, and the first ground conductor to be conducted with each other, the antenna being disposed on the board,
   wherein the one end side of the first ground conductor having the first cutaway part is opposite to a side at which the via conductor is disposed with the center of the board being provided between the one end side and the side at which the via conductor is disposed.

3. The antenna device according to claim 1, further comprising a second ground conductor that is conducted with the first ground conductor,
   wherein the artificial magnetic conductor includes a second cutaway part that has a substantially same area as the first cutaway part in the first ground conductor at a position substantially opposing to the first cutaway part in the first ground conductor, and
   the second ground conductor is disposed in the second cutaway part and separated from the artificial magnetic conductor.

4. The antenna device according to claim 1, further comprising a passive conductor that is disposed on the board on which the antenna is disposed.

5. The antenna device according to claim 1, wherein the first ground conductor and the artificial magnetic conductor are disposed opposedly and substantially overlap each other in a plan view.

6. The antenna device according to claim 2, wherein the antenna includes a first antenna conductor having a first feedpoint and a second antenna conductor having a second feedpoint, the second antenna conductor being connected to the first ground conductor via the via conductor, the first antenna conductor and the second antenna conductor configuring a dipole antenna.

7. The antenna device according to claim 6, wherein the artificial magnetic conductor includes a slit at a position where the first antenna conductor and the second antenna conductor that are formed on an upper layer are separated from each other.

* * * * *